(12) United States Patent
DiStefano (10) Patent No.: US 7,272,888 B2
(45) Date of Patent: Sep. 25, 2007

(54) METHOD OF FABRICATING SEMICONDUCTOR CHIP ASSEMBLIES

(75) Inventor: Thomas H. DiStefano, Monte Sereno, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/210,811

(22) Filed: Aug. 1, 2002

(65) Prior Publication Data

US 2002/0184758 A1 Dec. 12, 2002

Related U.S. Application Data

(60) Division of application No. 08/987,720, filed on Dec. 9, 1997, now Pat. No. 6,460,245, which is a continuation-in-part of application No. 08/610,610, filed on Mar. 7, 1996, now Pat. No. 5,834,339.

(60) Provisional application No. 60/032,722, filed on Dec. 13, 1996.

(51) Int. Cl.
*H05K 3/34* (2006.01)

(52) U.S. Cl. .............................. 29/832; 29/593; 29/830; 29/841; 156/249; 156/289; 438/118; 438/119

(58) Field of Classification Search ................. 29/860, 29/840, 832, 830, 593, 854, 841, 855, 558, 29/426.2, DIG. 1; 156/249, 289; 438/118, 438/119, FOR. 211
See application file for complete search history.

(56) References Cited

U.S. PATENT DOCUMENTS

| | | |
|---|---|---|
| 2,264,632 A | 12/1941 | Gerlitzki |
| 4,157,932 A | 6/1979 | Hirata |
| 4,219,596 A | 8/1980 | Takemoto et al. |
| 4,419,818 A | 12/1983 | Grabbe |
| 4,515,297 A | 5/1985 | Schoenthaler et al. |

(Continued)

FOREIGN PATENT DOCUMENTS

JP 62-102554 * 5/1987 .... 438/FOR. 211 X (Continued)

OTHER PUBLICATIONS

Lu et al., Evaluation of Die-Attach Adhesives by Curvature Measurements, IEEE Journal, InterSociety Conference on Thermal Phenomena, pp. 155-158, Feb. 8, 1992.

*Primary Examiner*—A. Dexter Tugbang
(74) *Attorney, Agent, or Firm*—Lerner, David, Littenberg, Krumholz & Mentlik, LLP (57) ABSTRACT

A method of making a microelectronic package includes providing a first microelectronic element having electrically conductive parts and including first and second surfaces and providing a compliant element including a releasable adhesive over the first surface of the first microelectronic element. A second microelectronic element having electrically conductive parts is abutted against the releasable adhesive so that the second microelectronic element is releasably assembled to the first microelectronic element and the electrically conductive parts of the first and second microelectronic elements are connected to one another. The releasably assembled package is tested to determine whether the package has been properly assembled. A curable liquid is then introduced between the first and second microelectronic elements of a properly assembled package and the curable liquid is cured to permanently assemble the first and second microelectronic elements together.

9 Claims, 7 Drawing Sheets

U.S. PATENT DOCUMENTS

| | | |
|---|---|---|
| 4,606,962 A | 8/1986 | Reylek et al. |
| 4,793,883 A | 12/1988 | Sheyon et al. |
| 4,803,124 A | 2/1989 | Kunz |
| 4,955,132 A | 9/1990 | Ozawa |
| 5,008,997 A | 4/1991 | Phy |
| 5,072,289 A | 12/1991 | Sugimoto et al. |
| 5,086,018 A * | 2/1992 | Conru et al. ............ 438/118 X |
| 5,148,265 A | 9/1992 | Khandros et al. |
| 5,148,266 A | 9/1992 | Khandros et al. |
| 5,157,828 A | 10/1992 | Coques et al. |
| 5,162,613 A * | 11/1992 | Schoenthaler ............. 29/832 X |
| 5,170,329 A | 12/1992 | Purdes |
| 5,232,532 A | 8/1993 | Hori |
| 5,258,330 A | 11/1993 | Khandros et al. |
| 5,347,159 A | 9/1994 | Khandros et al. |
| 5,377,077 A | 12/1994 | Burns |
| 5,390,844 A | 2/1995 | Distefano et al. |
| 5,398,863 A | 3/1995 | Grube et al. |
| 5,406,459 A | 4/1995 | Tsukamoto et al. |
| 5,414,298 A | 5/1995 | Grube et al. |
| 5,455,390 A | 10/1995 | DiStefano et al. |
| 5,491,302 A | 2/1996 | Distefano et al. |
| 5,518,964 A | 5/1996 | DiStefano et al. |
| 5,536,909 A | 7/1996 | Distefano et al. |
| 5,548,091 A | 8/1996 | DiStefano |
| 5,579,573 A | 12/1996 | Baker et al. |
| 5,616,385 A | 4/1997 | Rothrum et al. |
| 5,659,952 A | 8/1997 | Kovac et al. |
| 5,688,716 A | 11/1997 | DiStefano et al. |
| 5,777,379 A | 7/1998 | Karavakis et al. |
| 5,876,817 A | 3/1999 | Mathna et al. |

FOREIGN PATENT DOCUMENTS

| | | |
|---|---|---|
| SU | 1133 701 A | 4/1983 |
| WO | WO92/05582 | 4/1992 |
| WO | WO94/03036 | 3/1994 |

* cited by examiner

METHOD OF FABRICATING SEMICONDUCTOR CHIP ASSEMBLIES

CROSS REFERENCE TO RELATED APPLICATIONS

The present application is a divisional application of U.S. patent application Ser. No. 08/987,720 filed Dec. 9, 1997, now U.S. Pat. No. 6,460,245, which is a continuation in part of U.S. application Ser. No. 08/610,610 filed on Mar. 7, 1996, now U.S. Pat. No. 5,834,339 and claims the benefit of U.S. Provisional Application No. 60/032,722 filed on Dec. 13, 1996, and is related to commonly assigned U.S. patent application Ser. No. 08/726,697 filed on Oct. 7, 1996, now U.S. Pat. No. 5,776,796, the disclosures of which are hereby incorporated by reference herein.

BACKGROUND OF THE INVENTION

The present invention relates generally to the art of electronic packaging and more specifically relates to methods of making compliant semiconductor chip packages.

Modern electronic devices utilize semiconductor chips, commonly referred to as "integrated circuits" that incorporate numerous electronic elements. These chips are typically mounted on substrates, such as printed circuit boards, which physically support the chips and electrically interconnect each chip with other elements of the circuit. The substrate may be a part of a discrete chip package used to interconnect a single chip to external circuits or may be a "module" whereby one or more chips are mounted directly to a substrate which interconnects the chips with other circuit elements mounted to the substrate. In either case, the semiconductor chip(s) must be securely assembled with the substrate and must have reliable electrical interconnection(s) to the substrate.

Advanced semiconductor chips may require hundreds of input/output ("I/O") connections and the substrate must accommodate all of the required external electrical interconnections to the chip. Structures connecting the chip to the substrate ordinarily are subject to substantial strains caused by thermal cycling as temperatures within the chip package change during operation. Typically, the chip and the substrate expand and contract by different amounts. This causes the electrical contacts on the chip to move relative to the electrical contact pads on the substrate, thus deforming the electrical interconnections between the chip and substrate and placing them under mechanical stress. These repeated stresses can cause breakage of the electrical interconnections.

U.S. Pat. Nos. 5,148,265 and 5,148,266, the disclosures of which are hereby incorporated by reference herein, solve these problems by providing a flexible, sheet-like interposer including conductive terminals and flexible leads connected to and extending from the terminals. This flexible layer is mounted over the face of a semiconductor chip, preferably with a soft, compliant material disposed beneath the flexible layer and the terminals. The conductive terminals are electrically connected to electrical contacts on the semiconductor chip by the flexible leads. The conductive terminals can be connected or bonded to contact pads on a substrate so as to connect the semiconductor chip to the substrate. Because the terminals are moveable with respect to the contacts on the semiconductor chip, the assembly compensates for thermal expansion. Also, because the terminals are compliant or moveable in the vertical directions normal to the face of the chip, the terminals can be readily engaged with a test probe before assembly to the substrate. Thus, the subassembly can be tested prior to assembly to the substrate.

Commonly assigned U.S. Pat. No. 5,548,091, the disclosure of which is hereby incorporated by reference herein, discloses a prefabricated interposer or connection component for a semiconductor chip. The connection component includes a flexible dielectric film having top and bottom surfaces and further includes conductive terminals accessible at a surface of the dielectric film and flexible leads extending from the terminals. The connection component further includes an adhesive disposed on the bottom surface of the flexible dielectric film for bonding the bottom surface of the dielectric film to the semiconductor chip. The adhesive desirably is solid and non-tacky at temperatures below a preset activation temperature, but is adapted to reach a flowable condition upon heating to above the preset activation temperature, and to form a bond after such heating. Preferably, the adhesive is adapted to form a relatively weak bond to the bottom surface of the dielectric film or to the surface of the chip. Thus, the connection component can be removed from a chip after bonding thereto. This greatly facilitates repair and reclaim of chips from subassemblies which prove to be defective when tested. Such defective subassemblies may arise, for example, where there is a fault in the connection component or the bonding process.

For example, commonly assigned U.S. Pat. No. 5,659,952, the disclosure of which is hereby incorporated by reference herein, discloses a method of fabricating a compliant interface for a semiconductor chip typically comprised of a compliant encapsulation layer having a controlled thickness. In certain preferred embodiments of the '952 Patent, a connection component, such as a flexible, substantially inextensible dielectric film, is provided. A compliant element, such as a plurality of compliant pads defining channels therebetween, is attached to a first surface of the first support structure. The compliant pad/connection component subassembly is then assembled with a semiconductor chip having a front face including a plurality of contacts. During assembly, the front face of the semiconductor chip is abutted against the compliant pads and the contacts are electrically connected to corresponding terminals on a second side of the dielectric film. A curable liquid encapsulant material, such as a curable silicone elastomer, is then provided between the semiconductor chip and the dielectric film and around the compliant pads while the chip and the dielectric film are held in place. The liquid encapsulant is then cured, whereby the compliant pads and the cured encapsulant provide a substantially continuous compliant interface between the semiconductor chip and the flexible dielectric film.

The above-referenced '697 application discloses a method of encapsulating a semiconductor chip package. According to preferred embodiments of the '697 application, a semiconductor chip package assembly has a compliant element or spacer layer between the top surface of a flexible dielectric film and the contact bearing surface of a semiconductor chip. The flexible dielectric film has conductive leads thereon, the leads having first ends which are electrically connected to the terminals and second ends which are bonded to the respective chip contacts. A protective layer is attached on a bottom surface of the dielectric film to cover the terminals on the substrate and to seal any apertures in the dielectric film. After attachment of the protective layer, a flowable, curable encapsulant material is deposited around at least a portion of a periphery of the semiconductor chip so as to encapsulate the conductive leads. The protective layer prevents the curable encapsulant from flowing through any dielectric film apertures. The encapsulant material is then cured or at least partially cured to allow for handling and/or further processing.

SUMMARY OF THE INVENTION

One aspect of the present invention provides a method of making a microelectronic package. The method includes providing a first microelectronic element having electrically conductive parts and including a first surface and a second surface. The first microelectronic element preferably includes a flexible dielectric film having conductive terminals accessible at one or more surfaces thereof and flexible leads integrally connected to the conductive terminals and extending therefrom. A compliant element, such as a silicone elastomer, is preferably provided over the first surface of the first microelectronic element. The combination of the first microelectronic element and the compliant element is hereinafter referred to as the "package subassembly." The compliant element preferably includes a "releasable adhesive," i.e., an adhesive material which is capable of at least temporarily securing two or more microelectronic elements together so that the elements will remain together, but so that the elements can be separated from one another deliberately without destroying the elements.

In certain preferred embodiments, a second microelectronic element having electrically conductive parts is provided. The second microelectronic element preferably includes a semiconductor chip having a front face including electrical contacts on a peripheral region of the front face. The second microelectronic element is abutted against the releasable adhesive so that the second microelectronic element is releasably assembled to the first microelectronic element. For example, when the second microelectronic element is a semiconductor chip, the chip is preferably assembled with the package subassembly by abutting the front face of the semiconductor chip against the releasable adhesive. Thus, the first and second microelectronic elements form a releasably assembled package. The package may be tested and evaluated before the elements are permanently assembled together. If the releasably assembled chip package fails any one of a number of tests then the releasable adhesive allows the relatively expensive microelectronic elements of the package, such as a semiconductor chip, to be easily disassembled from the package and reassembled with other microelectronic elements or package subassemblies. The bond created by the releasable adhesive is relatively weak so that the chip can be removed from the package subassembly without destroying the chip or rendering the chip useless. The releasable adhesive may include a material selected from the group consisting of pressure-sensitive adhesives, thermoplastics and polyimide siloxane adhesives. In certain embodiments, the compliant element may completely comprise the releasable adhesive. However, in other embodiments the compliant element may include a core or central region including a compliant material, such as a silicone elastomer, and one or more exterior surface regions including the releasable adhesive. Most preferably the releasable adhesive is provided at a surface of the compliant element which is remote from the first microelectronic element. The remote surface of the compliant element is further defined below as the surface which is preferably abutted against the second microelectronic element.

After the first microelectronic element and the compliant element including the releasable adhesive have been assembled together, the resulting package subassembly may be stored prior to assembly with the chip or other second microelectronic element. The package subassembly is preferably prepared for storage by providing a release liner, such as a relatively thin, flexible plastic sheet, over the releasable adhesive at the remote surface of the compliant element. The release liner may include a release treatment such as the synthetic flourine-containing resin commonly sold under the trademark Teflon®, at one or more surfaces thereof, so that, when necessary, the release liner may be readily removed from the compliant element to expose the releasable adhesive. Package subassemblies manufactured according to this particular preferred embodiment may be fabricated at one location, placed in storage and then shipped to remote manufacturing facilities for chip or die attach processes.

In certain preferred embodiments, after the first and second microelectronic elements have been releasably assembled together, the elements are electrically connected to one another by bonding the flexible leads of the first microelectronic element to the electrical contacts of the second microelectronic element. The microelectronic package is then tested and evaluated to determine whether the package is operating properly and to uncover any damage and/or defects in the package. Common defects typically include misalignment of the contacts of the second microelectronic element with respect to the flexible leads of the first microelectronic element and/or misalignment of the compliant element over the first surface of the first microelectronic element. As such, one portion of the test may include an inspection to assure that the electrically conductive parts of the first and second microelectronic elements are in substantial alignment with one another. Another portion of the test may include engaging the electrically conductive parts of the first microelectronic element with a test probe to determine whether the electrically conductive parts of the first and second microelectronic elements have been properly interconnected. If testing uncovers a defect in the package after the leads have been bonded to the chip contacts, the flexible leads may be broken and the lead remnants/package subassembly removed so that the second microelectronic element may be reused on another package subassembly. The testing step may precede the step of electrically interconnecting the first and second microelectronic elements or may be conducted after the first and second microelectronic elements have been electrically interconnected.

The utilization of a releasable adhesive for releasably assembling the second microelectronic element with the package subassembly makes it possible to test and evaluate the operability of the package before the second microelectronic assembly is permanently assembled to the package subassembly. As a result, a manufacturer may selectively remove or disassemble the second microelectronic element from the microelectronic package subassembly if any defects are discovered during testing and evaluation of the packages. As a result, operationally sound microelectronic elements (i.e., "good" semiconductor chips) may be reclaimed from defective packages without destroying the integrity of the chips so that the chips may be reassembled with other fully operational package subassemblies. This particular benefit can result in substantial cost savings because complex microelectronic elements, such as semiconductor chips, are relatively expensive in comparison to the other elements of the microelectronic package (e.g., the flexible dielectric film).

After the releasably assembled package has passed the tests described above, the first and second microelectronic elements may be permanently assembled together by using a "lock-down" encapsulant. The "lock-down" encapsulant preferably includes a curable liquid material such as a curable silicone elastomer. Before the liquid encapsulant is introduced, a protective coverlay is preferably provided over the second or exterior surface of the first microelectronic elements to isolate and protect the conductive terminals from the curable liquid encapsulant so that the terminals are not covered by the curable liquid and remain accessible after this stage of the assembly process. The curable liquid encapsulant is then provided between the first and second microelectronic elements and around the compliant element. The liquid encapsulant preferably surrounds the compliant element and those portions of the electrically conductive parts lying between the first and second microelectronic elements. In further preferred embodiments, a second protective coverlay may be provided over the rear surface of the second microelectronic element to prevent the curable liquid encapsulant from coming in contact with the rear surface thereof. The second protective coverlay is preferably substantially similar to the first protective coverlay. The curable liquid encapsulant may then be cured to permanently assemble the first and second microelectronic elements. The cured liquid encapsulant and the compliant element preferably provide a continuous, uniform, compliant layer between the first and second microelectronic elements. The cured encapsulant and the compliant element are preferably CTE matched and comprise materials which are substantially similar, i.e., silicone elastomer.

After the curable liquid encapsulant has been cured, the cured encapsulant layer may be severed outside the perimeter of the second microelectronic element to provide an individual microelectronic package having a compliant bumper. The protective coverlays may be maintained in place while the package is in storage to protect the package from contamination. Preferably, the protective coverlay over the exterior surface of the first microelectronic element is maintained in place while the package is in storage in order to isolate the conductive terminals from contaminants. When it is desirable to electrically connect the permanently assembled microelectronic package with an external circuit element, such as a printed circuit board, the protective coverlay may be removed from the exterior surface of the first microelectronic element to expose the conductive terminals so that the conductive terminals may be electrically interconnected with contacts on the external circuit element.

In other preferred embodiments, the compliant element may include a plurality or array of compliant pads, whereby the compliant pads define channels running between any two adjacent pads. The compliant pads preferably include the releasably adhesive, most preferably at one or more surface regions thereof. When the curable liquid encapsulant is provided between the first and second microelectronic elements, the liquid encapsulant flows through the channels between the compliant pads. After the liquid encapsulant has been cured, the cured encapsulant and the compliant pads provide a continuous and uniform compliant layer between the first and second microelectronic elements.

In other preferred embodiments of the present invention, a method of making a plurality of microelectronic packages includes providing a plurality of first microelectronic elements, such as the flexible dielectric sheet described above, having electrically conductive parts and including first and second surfaces. A plurality of compliant elements are then provided over the first surfaces of the first microelectronic elements. Each compliant element includes a releasable adhesive at a surface remote from the first microelectronic element. A plurality of second microelectronic elements, such as the semiconductor chips described above, are then provided and abutted against the releasable adhesive so that the second microelectronic elements contact the releasable adhesive of the compliant element and are releasably assembled with the first microelectronic elements. The first and second microelectronic elements are then electrically interconnected with one another. The resulting plurality of microelectronic packages are then tested and evaluated using the techniques described above. As mentioned above, testing of the packages may occur before or after the plurality of first and second microelectronic elements have been electrically interconnected with one another, or both before and after such electrical interconnection. During testing, the releasably assembled packages are evaluated to identify properly and improperly assembled packages. Preferably, the first and second microelectronic elements of any improperly assembled packages are disassembled so that the second microelectronic elements may be reclaimed. The reclaimed second microelectronic elements may then be reassembled with other package subassemblies to provide reassembled microelectronic packages. The reassembled packages are then electrically interconnected and re-tested to determine whether they are properly or improperly assembled. A curable liquid is then provided between the first and second microelectronic elements of the properly assembled packaged and the curable liquid is cured so that the first and second microelectronic elements are permanently assembled to one another.

These and other objects, features and advantages of the present invention will be more readily apparent from the detailed description of the preferred embodiment set forth below and when taken in conjunction with the accompanying drawings.

DETAILED DESCRIPTION

Figure 1A:
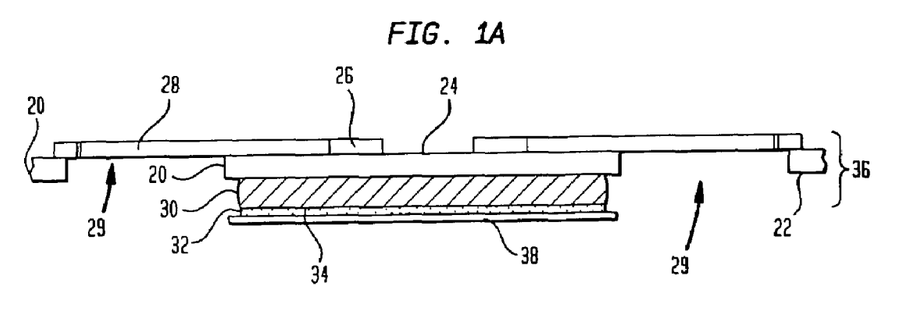
FIG. 1A is a fragmentary sectional view of a microelectronic package during one stage of an assembly method in accordance with preferred embodiments of the present invention.

One aspect of the present invention provides a method of making a microelectronic package. Referring to FIG. 1A, a first microelectronic element 20 includes a flexible sheet-like dielectric film having a first surface 22 and a second surface 24. The terms "first" and "second" are used herein to indicate directions relative to the structure of the package itself. It should be understood that these terms are used to refer to the frame of reference of the package, and not to the ordinary, gravitational frame of reference. Likewise, the terms "front" and "rear" should also be understood as referring to the frame of reference of the component itself. The dielectric film 20 is preferably formed from a polymeric material such as polyimide having a typical thickness of approximately between 25 to 75 microns. The dielectric film 20 has conductive terminals 26 accessible at the second surface 24 thereof and electrical parts or flexible leads 28 integrally connected to and extending from the conductive terminals 26. The conductive terminals 26 and the flexible leads 28 are preferably defined using photolithographic techniques whereby a single sheet of copper is attached to the first surface 22 of the flexible dielectric film 20, such as by using lamination, electroplating or sputtering processes. The flexible leads 28 are preferably configured to be releasably detachable from the flexible dielectric film 20, such as described in commonly assigned U.S. Pat. Nos. 5,489,749 and 5,536,909, the disclosures of which are hereby incorporated by reference herein. The dielectric film 20 also includes bond windows 29 for accessing the flexible leads during a bonding operation, as will be described in more detail below.

A compliant element 30, preferably comprising a silicone elastomer is provided over the first surface 22 of the dielectric film 20. The compliant element 30 may be formed directly on the first surface 22 of the flexible dielectric film 24, such as by using the techniques disclosed in the aforementioned '592 patent. The compliant element 30 may also be pre-formed and stored separately from the flexible dielectric film 20 as disclosed in commonly assigned U.S. patent application Ser. No. 08/879,922, the disclosure of which is hereby incorporated by reference herein. Compliant element 30 includes a releasable adhesive 32 at a surface 34 of the compliant element 30 which is remote from the flexible dielectric film 20. The releasable adhesive 32 is preferably selected from the group consisting of pressure sensitive adhesives ("PSA"), thermoplastic materials and polyimide siloxane adhesives. The flexible dielectric film 20 and the compliant element 30 including the releasable adhesive 32 form a microelectronic package subassembly 36 (hereinafter referred to as the "package subassembly") which may be placed in storage, or shipped to another location before being assembled with another microelectronic element. A flexible release liner 38 is preferably provided over the releasable adhesive 32 before the package subassembly 36 is placed in storage in order to isolate the releasable adhesive 32 from contaminants.

Figure 1B:
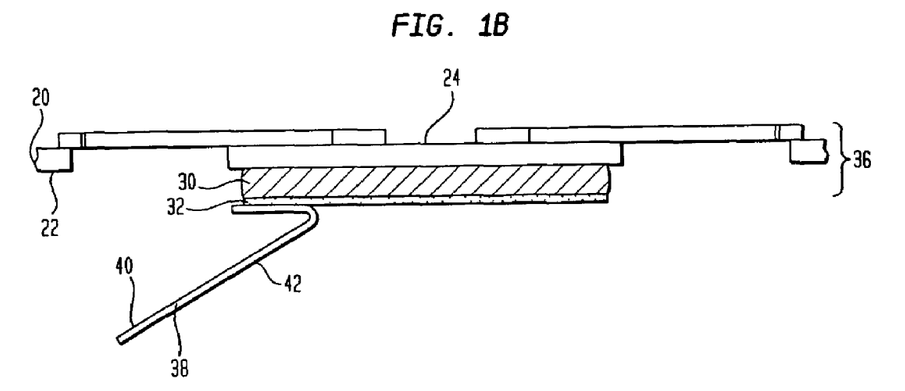
FIGS. 1B through 1H show the microelectronic package of FIG. 1A during further stages of an assembly process in accordance with preferred embodiments of the present invention.

Referring to FIG. 1B, before the package subassembly 36 is releasably assembled to a second microelectronic element, such as a semiconductor chip (not shown), the release liner 38 is removed to expose the releasable adhesive 32. Prior to peeling off the release liner 38, heat may be applied to the exterior surface 40 of the release liner 38 to reduce the level of adhesion between the release liner 38 and the releasable adhesive 32, thereby insuring that the compliant element 30 will remain on the flexible dielectric film 20. After heat has been applied to the release liner 38, the flexible release liner 38 should preferably be pulled at a severe angle of departure which further insures that the compliant element 30 remains on the first surface 22 of the flexible dielectric film 20. A surface treatment 42, such as a synthetic fluorine containing resin sold under the trademark Teflon®, may also be provided at one or more surfaces of the release liner 38 to further reduce the level of adhesion between the release liner 38 and the releasable adhesive 32. As a result, the compliant element 30 will remain on the first surface 22 of the flexible dielectric film 20 when the release liner 38 is removed.

Figure 1C:
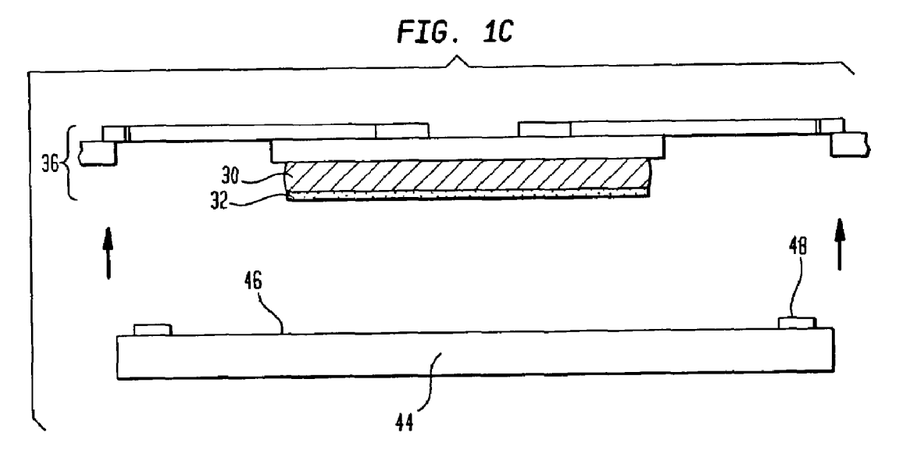

Referring to FIG. 1C, after the release liner 38 has been removed from the compliant element 30 to expose the releasable adhesive 32, the package subassembly 36 is juxtaposed with a second microelectronic element 44, such as a semiconductor chip. The semiconductor chip 44 has a generally planar front face 46 including electrical parts or contacts 48 formed on peripheral regions thereof. With the particular chip shown, the contacts 48 are generally arranged in rows (not shown) which are adjacent and run parallel to each edge of the chip 44. The contacts 48 in each row are spaced at very close intervals, typically about 100 to about 250 micrometers center-to-center.

Figure 1D:
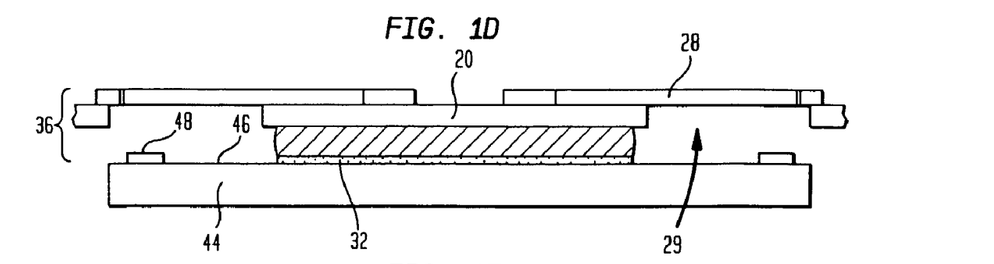

Referring to FIG. 1D, the semiconductor chip 44 is releasably assembled with the package subassembly 36 by abutting the front face 46 of the semiconductor chip 44 against the releasable adhesive 32 so that the contacts 48 of the semiconductor chip 44 are aligned with the bond windows 29 and the flexible leads 28 of the flexible dielectric film 20. Alignment of the contacts 48 with the bond window 29 and flexible leads 28 facilitates electrical connection of the flexible leads 28 with the contacts 48, as will be described in more detail below. The releasably assembled package is then tested and/or evaluated to determine whether the package has been properly or improperly assembled and/or to identify any defects. Common defects in the package may include misalignment of the chip contacts 48 with respect to the flexible leads 28 or misalignment of the compliant element 30 between the flexible dielectric film 20 and the semiconductor chip 44. As will be discussed in more detail below, another problem may include improper electrical connection of the chip 44 and the conductive terminals 26 of the dielectric film 20.

Figure 1E:
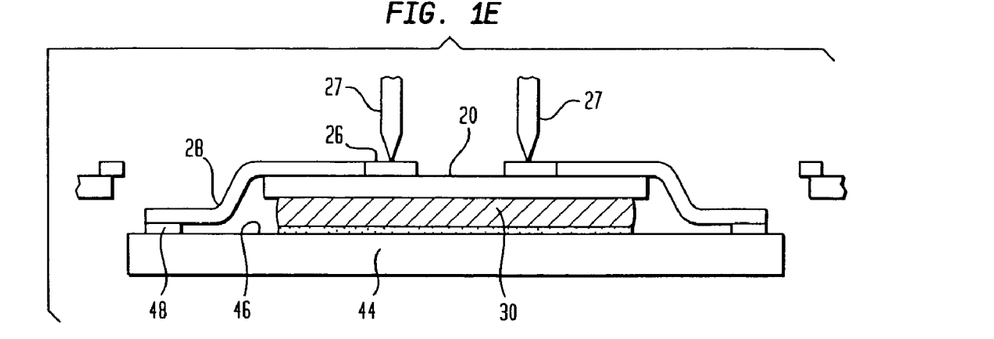
Figure 1F:
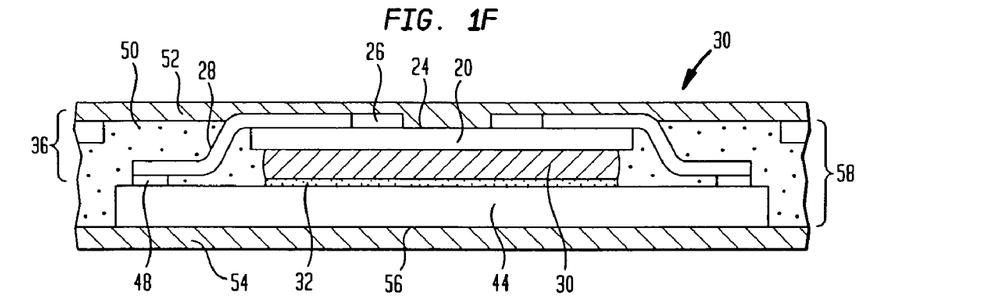

Referring to FIGS. 1E and 1F, the flexible leads 28 are then detached and bonded to the contacts 48 on the front face 46 of the semiconductor chip 44 such as by using ultrasonic or thermosonic bonding techniques conventionally known in the art or by using the various bonding techniques disclosed in U.S. Pat. Nos. 5,398,863; 5,390,844; 5,536,909 and 5,491,302. The bonding of the flexible leads 28 to their respective chip contacts 48 provides some mechanical strength to the package so that the releasable adhesive 32 does not peel off or delaminate from the front face 46 of the semiconductor chip 44 and/or the flexible dielectric film 20. However, as described below, the semiconductor chip 44 can still be non-destructively removed from the releasable adhesive 32 of the compliant element 30 after the flexible lead bonding operation by breaking the leads 28. The electrical connections of the package may be tested by engaging the terminals 26 of the flexible dielectric film 20 with test probes (FIG. 6A) to assure that the flexible leads 28 of the flexible dielectric film 20 are properly connected to the contacts 48 of the semiconductor chip 44.

If testing identifies an improperly assembled or defective semiconductor chip package, then the semiconductor chip 44 may be disassembled from the package subassembly 36 and reassembled with another package subassembly. The releasable adhesive 32 enables the semiconductor chip 44 to be readily removed from a defective package and transferred to another package. Preferably the chip 44 will be disassembled before the flexible leads 28 are bonded to the contacts 48. However, if the defects in the package are not discovered until after the flexible leads 28 have been bonded to the chip contacts 48, the flexible leads 28 may be broken pr pulled away from chip contacts 48 and the leads 28 and package subassembly 36 may be removed so that the chip 44 may be reassembled with another package subassembly 36.

After testing and evaluation of the chip package 58 discloses that the package subassembly 36 and the chip 44 have been assembled within acceptable tolerances and that none of the microelectronic elements are defective, the semiconductor chip 44 and the flexible dielectric film 20 may be permanently assembled together by adding a curable liquid encapsulant 50 around the edges of the chip package 58 and curing the encapsulant. The cured encapsulant mechanically connects and/or locks the semiconductor chip 44 and the flexible dielectric film 20 together so that the compliant element 30 cannot be easily removed from the semiconductor chip 44 and/or the flexible dielectric film 20.

Referring to FIG. 1F, a curable liquid encapsulant 50, such as a liquid silicone elastomer, is provided between the semiconductor chip 44 and the flexible dielectric film 20. Before the curable liquid 50 is introduced, a first protective coverlay 52 is preferably provided over the second surface 24 of the flexible dielectric film 20 to cover the bond windows 29 so as to prevent the curable liquid 50 from passing through the bond windows 29 and contacting the conductive terminals 26 at the second surface 24 of the flexible dielectric film 20. A second protective coverlay 54 may also be provided over the rear surface 56 of the semiconductor chip 44 to prevent the curable liquid 50 from coming in contact with the rear surface 56. After the first and second protective coverlays 52 and 54 have been provided over the respective exterior surfaces of the semiconductor chip 44 and the dielectric film 20, the curable liquid encapsulant 50 is allowed to flow between the semiconductor chip 44 and the dielectric film 20 and around the flexible leads 28. The curable liquid encapsulant 50 is then cured using energy such as heat or ultraviolet light. The encapsulant 50 is preferably CTE matched with the compliant element 30 so as to minimize the effects of thermal cycling. The encapsulant preferably comprises the same material as the compliant element 30, i.e., a silicone elastomer material. The cured encapsulant 50 provides a substantially continuous compliant layer between the flexible dielectric film 20 and the semiconductor chip 44.

Figure 1G:
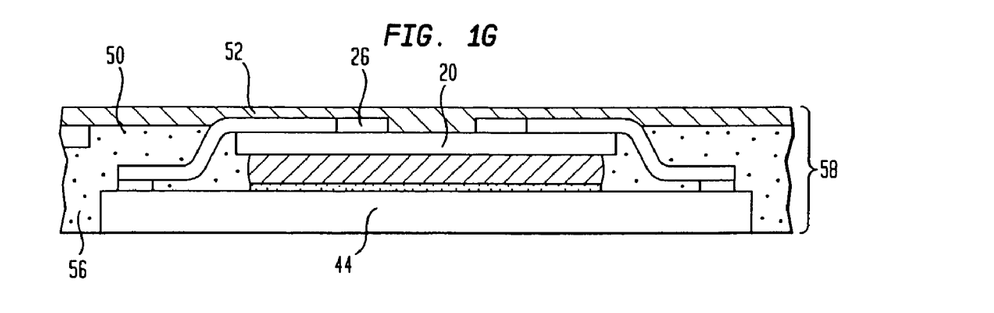
Figure 1H:
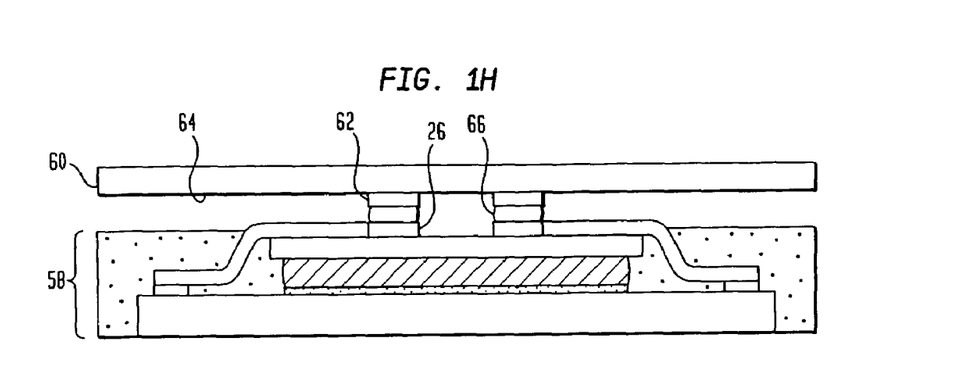

Referring to FIGS. 1F and 1G, the cured encapsulant 50 as well as the first and second protective coverlays 52 and 54 and the dielectric film 20 may be severed outside the periphery of the semiconductor chip 44 along the axis designated A-A. Severing the cured encapsulant layer 50 outside the periphery of the semiconductor chip 44 provides the microelectronic package 44 with a protective bumper 56 around the periphery thereof. The first protective coverlay 52 may be maintained in place over the conductive terminals 26 accessible at the second surface 24 of the dielectric film 20 while the package 58 is in storage. The second coverlay 54 may also remain in place for additional protection. As shown in FIG. 1H, when it is desirable to electrically connect the microelectronic package 58 with an external circuit element 60 such as a printed circuit board, the first protective coverlay 52 may be removed to expose the conductive terminals 26. The package 58 may then be electrically connected to the external circuit element 60. The conductive terminals 26 of the microelectronic package 58 are preferably interconnected with contacts 62 on a first surface 64 of the external circuit element 60 via solder balls 66 provided therebetween.

Figure 2A:
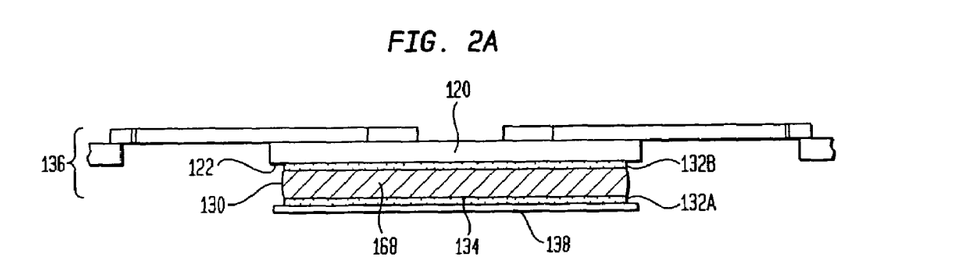
FIG. 2A shows a fragmentary sectional view depicting a microelectronic package during one stage of an assembly process in accordance with further embodiments of the present invention.
Figure 2B:
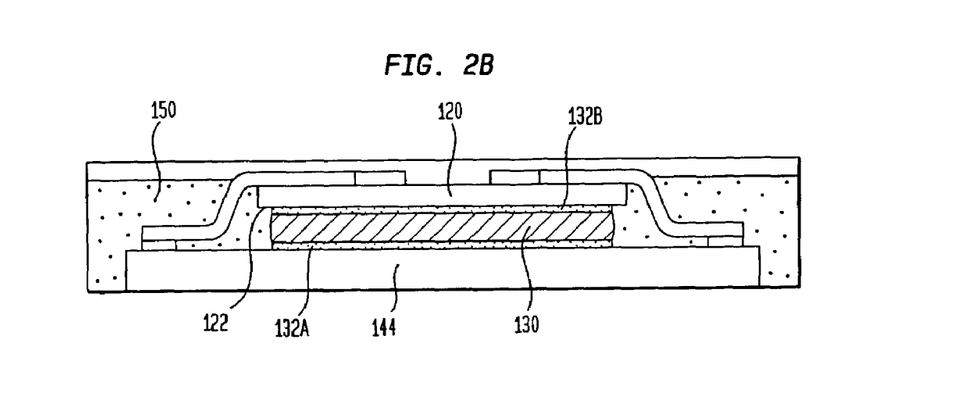
FIG. 2B shows the microelectronic package of FIG. 2A during further stages of an assembly process in accordance with preferred embodiments of the present invention.

Referring to FIGS. 2A-2B, in another embodiment of the present invention, the flexible dielectric film 120 and the compliant element 130 comprise a microelectronic package subassembly 136 which is substantially similar to that described above with reference to FIGS. 1A-1H. In this particular preferred embodiment, the compliant element 130 includes a core region 168 of a compliant material such as a silicone elastomer, a first layer of a releasable adhesive 132A provided at a surface region 134 of said compliant element 130 remote from said dielectric film 120 and a second layer of a releasable adhesive 132B provided between the first surface 122 of the flexible dielectric film 120 and the core region 168 of the compliant element 130. The package subassembly 136 includes a flexible release liner 138 provided over the first layer of the releasable adhesive 132A. Referring to FIG. 2B, prior to assembly with the semiconductor chip 144, the flexible release liner 138 is removed to expose the first layer of the releasable adhesive 132A. The semiconductor chip 144 is then abutted against the releasable adhesive 132A so that the semiconductor chip 144 and the dielectric film 120 are releasably assembled together. The semiconductor chip 144 and the dielectric film 120 are then electrically interconnected as described above. After testing reveals that the semiconductor chip 144 and the dielectric film 120 have been properly assembled, a curable liquid 150 is provided between the chip 144 and the dielectric film 120 and the encapsulant is cured in accordance with the techniques described above. If a package has been improperly assembled, the compliant element 130 according to this particular embodiment allows a manufacturer to selectively disassemble the compliant element 130 from the dielectric film 120 with a minimum amount of the compliant element material left on either the dielectric film 120 or the chip 144. For example, if the compliant element 130 has been misapplied or misaligned with the first surface 122 of the flexible dielectric film 120 during attachment, the compliant element 130 including the first and second releasable adhesive layers 132A and 132B may be removed therefrom and replaced with another compliant element 130.

The compliant element shown in FIGS. 1A-1H and 2A-2B may be maintained separately from the flexible dielectric film until immediately prior to assembly of the semiconductor chip with the dielectric film. For example, the compliant element may be transferable as described in the above-mentioned '922 application. In the '922 application, the compliant element is provided between first and second flexible release liners so that the compliant element may be stored and maintained separately from the flexible dielectric film. Immediately prior to assembly, the first release liner is removed to expose one surface of the compliant element so that the compliant element may be assembled with the flexible dielectric film. The second release liner is then removed to expose another surface of the compliant element so the compliant element may be assembled with the front face of a semiconductor chip. In other preferred embodiments, the compliant element may be screened or stencil printed directly onto a surface of the flexible dielectric film and then cured into a solid but compliant form as disclosed in the aforementioned '952 patent. In still further embodiments, some of the various layers comprising the compliant element may be stenciled, screened or deposited in a liquid form on the first surface of the flexible dielectric film and then at least partially cured.

After the compliant element has been partially cured, other layers, such as layers of the releasable adhesive, may then be attached thereto.

Figure 3A:
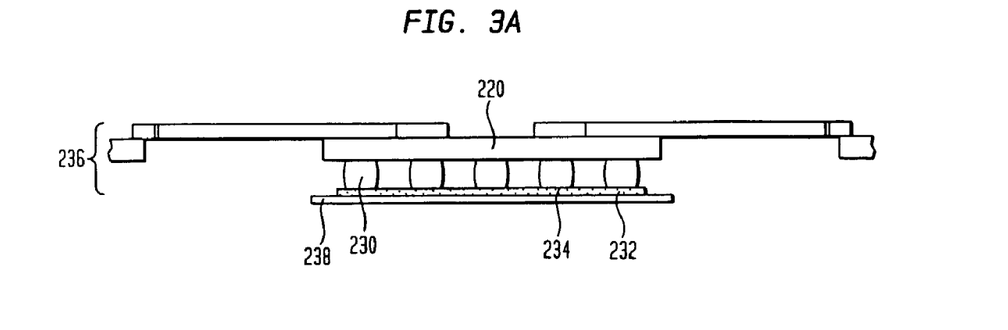
FIG. 3A shows a fragmentary sectional view depicting a microelectronic package during an assembly process in accordance with still further embodiments of the present invention.
Figure 3B:
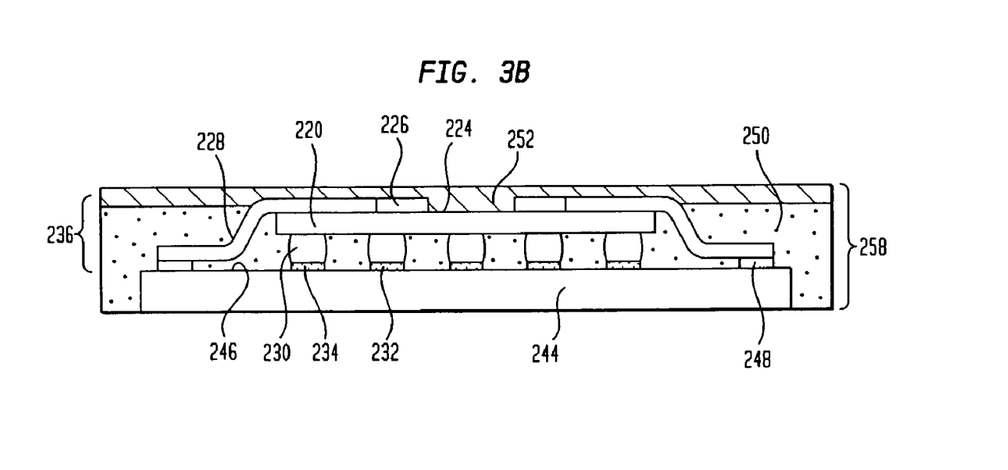
FIG. 3B shows the microelectronic package of FIG. 3A during further stages of an assembly process in accordance with preferred embodiments of the present invention.

Referring to FIG. 3A, in another embodiment of the present invention, the package subassembly 236 is substantially similar to that described above, however, the compliant element 230 in this particular embodiment includes a plurality or array of compliant pads as disclosed in the aforementioned U.S. Pat. No. 5,659,952, the disclosure of which is hereby incorporated by reference herein. The compliant pads 230 include the releasable adhesive 232 provided over surfaces 234 of the compliant pads 230 which are remote from the flexible dielectric film 220. The compliant pads 230 preferably include a release liner 238 provided over the releasable adhesive 232 which is removed prior to assembly of the package subassembly 236 with another microelectronic element. Referring to FIG. 3B, after the flexible release liner 238 has been removed, a semiconductor chip 244 is assembled with the package subassembly 236 by abutting the front face 246 of the semiconductor chip 244 against the releasable adhesive 232 of the compliant pads 230. The flexible leads 228 are then bonded to the contacts 248 of the semiconductor chip 244 to electrically interconnect the flexible dielectric film 220 and the semiconductor chip 244. The releasably assembled package 258 is then tested and evaluated to determine whether it has been properly assembled and to uncover any damage or defects thereto. If the package 258 is found to be improperly assembled or defective, the semiconductor chip 244 may be selectively disassembled from the flexible dielectric film 220 by peeling the semiconductor chip 244 from the compliant pads 230. When testing has revealed that the package has been properly assembled, a curable liquid encapsulant 250 may be provided between the flexible dielectric film 220 and the semiconductor chip 244 as described above. A protective coverlay 252 over the conductive terminals 226 at the second surface 224 of the dielectric film 220 prevents the terminals 226 from being covered by the curable liquid 250 and allows the conductive terminals 226 to remain accessible.

Figure 4:
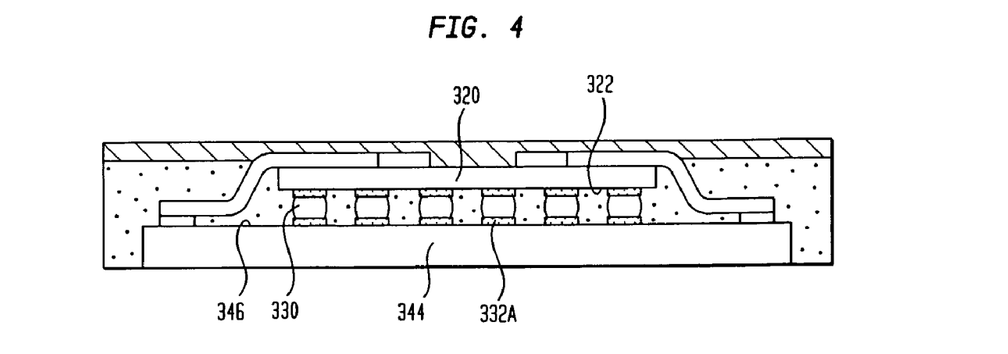
FIG. 4 shows a fragmentary sectional view of a microelectronic package in accordance with yet further embodiments of the present invention.

Referring to FIG. 4, in another preferred embodiment of the present invention, the microelectronic package is substantially similar to that shown in FIGS. 3A-3B and described above. In this particular embodiment, the plurality of compliant pads 330 include a first layer 332A of a releasable adhesive between the compliant pads 330 and the front face 346 of the semiconductor chip 344 and a second layer 332B of a releasable adhesive between the compliant pads 330 and the first surface 322 of the flexible dielectric film 320. The first layer of the releasable adhesive 332A allows the semiconductor chip 344 to be releasably assembled to the dielectric film 320 so that the semiconductor chip 340 may be reclaimed if testing shows that the package has been improperly assembled. The second layer 332B of the releasable adhesive enables the compliant pads 330 to be readily removed from attachment to the dielectric film 320 if it is determined that the compliant pads 330 have been improperly assembled with the dielectric film 320. The chip package 358 is then electrically interconnected, tested and encapsulated using the techniques described above.

Figure 5:
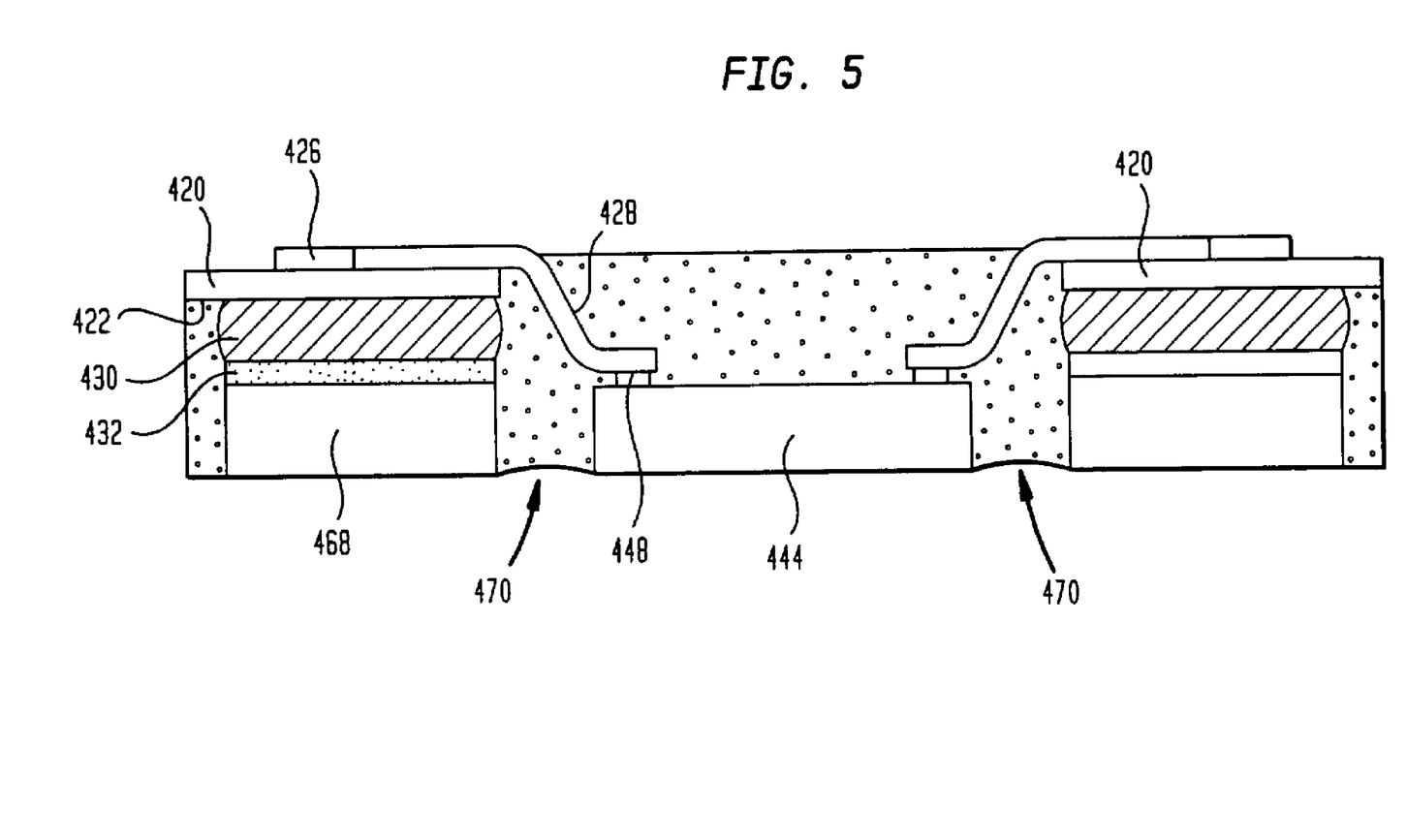
FIG. 5 shows a microelectronic package in accordance with still further embodiments of the present invention.

Referring to FIG. 5, in yet another embodiment of the present invention, the microelectronic package includes a "fan-out" chip package embodiment. A "fan-out" chip package is defined as a microelectronic package where the leads 428 are connected to the respective contacts 448 on the semiconductor chip 444 and extend outwardly beyond the periphery of the semiconductor chip 444 to terminals 426 which are located beyond the periphery of the chip 444. In contrast, a "fan-in" chip package is generally defined as a microelectronic package wherein the flexible leads are connected to the chip contacts and extend inwardly over the face of the semiconductor chip toward the conductor terminals. In the particular "fan-out" package shown in FIG. 5, the flexible dielectric film 420 and the compliant element 430 are attached to a stiffener plate or ring 468 having an aperture 470 in the center thereof and the semiconductor chip 444 is disposed in the aperture 470. The compliant element 430 includes a releasable adhesive 432 remote from the first surface 422 of the dielectric film 420 so that the ring 468 may be releasably assembled with the dielectric film 420. The "fan-out" chip package is then electrically interconnected, tested and encapsulated as described above.

Figure 6A:
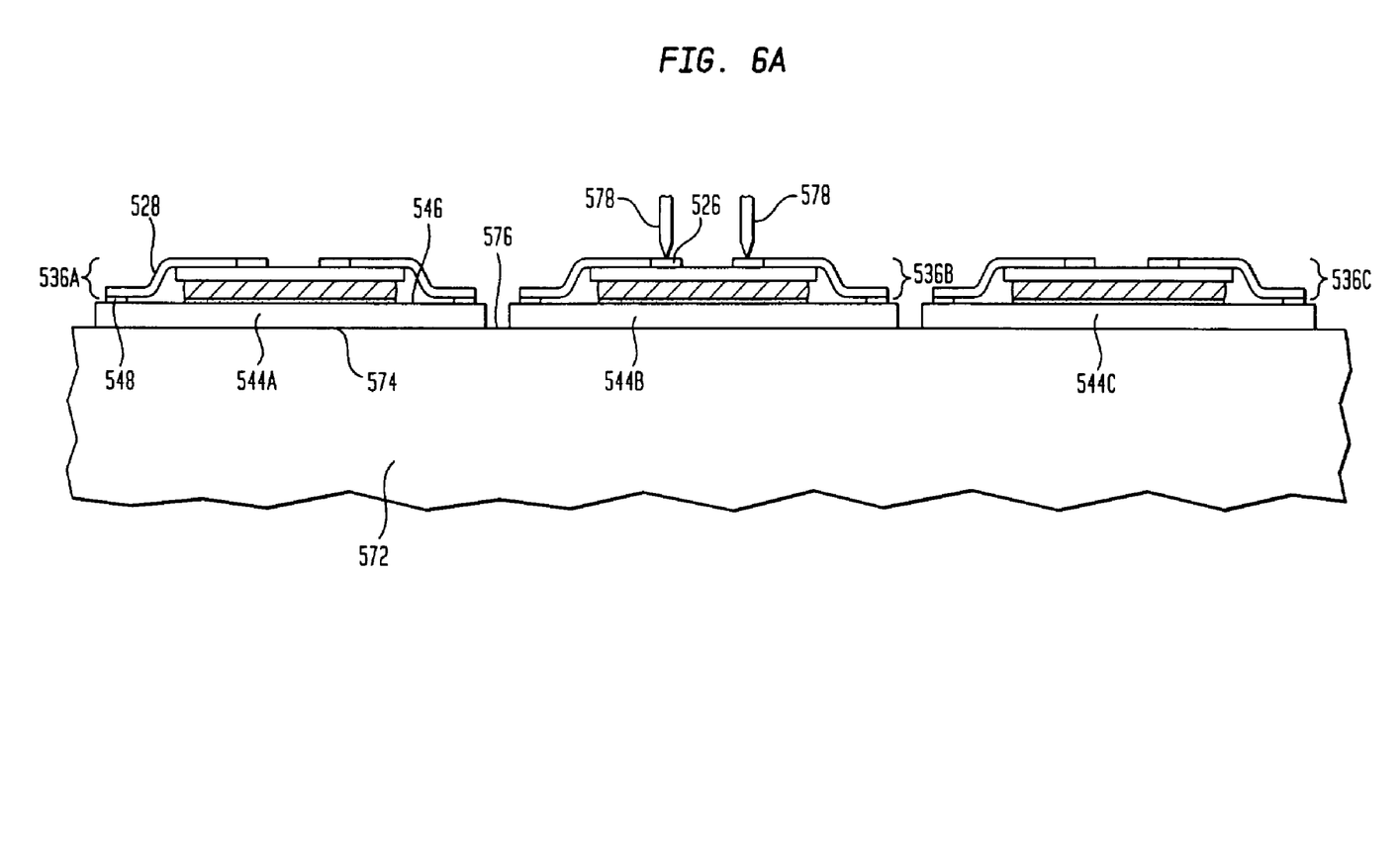
FIG. 6A shows a fragmentary side view of a method of making a plurality of microelectronic packages according to another embodiment of the present invention.
Figure 6B:
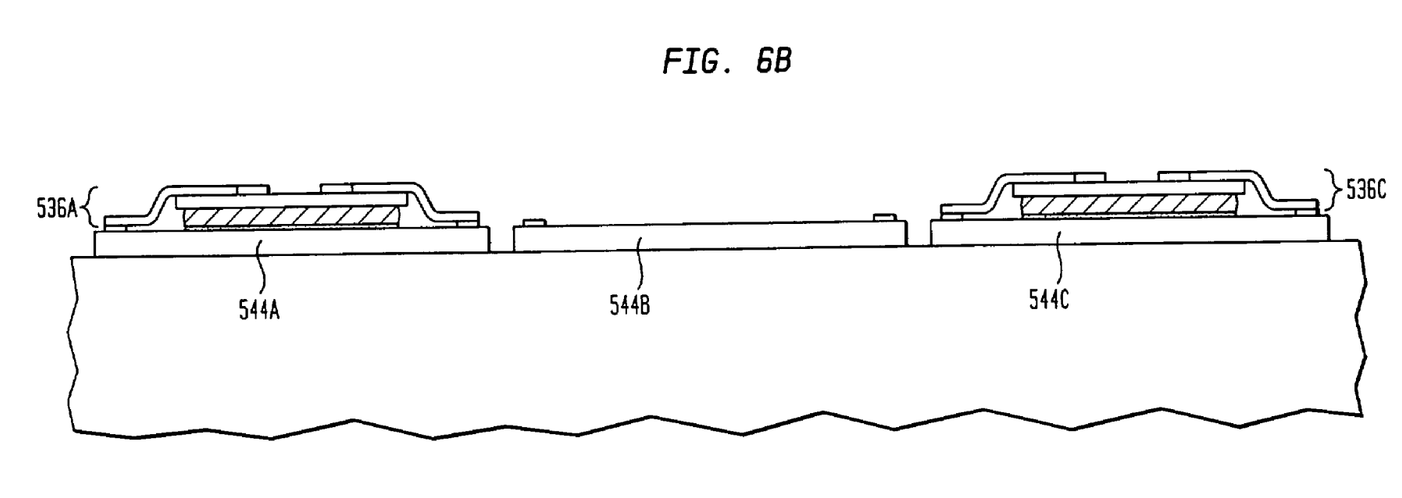
FIG. 6B shows the microelectronic packages in FIG. 6A during a further stage of the assembly process.

Still further preferred embodiments of the present invention provide methods of making a plurality of microelectronic packages, whereby the assembly methods utilized are substantially similar to those described above. Referring to FIGS. 6A and 6B, in one particular embodiment, a plurality of semiconductor chips 544A, 544B and 544C are provided on a supporting element 572. The semiconductor chips 544A, 544B and 544C are arranged with the rear surfaces 574 thereof in contact with a top surface 576 of the supporting element 572. Package subassemblies 544A, 544B and 544C, substantially similar to those described above, are then abutted against the front faces 546 of the semiconductor chips 544A, 544B and 544C so that the chips and package subassemblies are releasably assembled with one another. The flexible leads 528 of each package subassembly are then bonded to the contacts 548 of the chips associated therewith in order to electrically interconnect the chip and the dielectric film 520. The plurality of microelectronic packages are then tested and evaluated in accordance with the parameters outlined above. One such test (shown in FIG. 6A) includes engaging the conductive terminals 526 of the releasably assembled packages with a set of test probes 578 to evaluate the electrical interconnections between the chips and the dielectric films. Referring to FIG. 6B, after testing, the package subassemblies of any defective packages are peeled from the semiconductor chip so that the chip may be reclaimed and reassembled with another package subassembly. In FIG. 6B, the package including the middle semiconductor chip 544B was found to be defective and/or improperly assembled. As such, the defective package subassembly 536B was peeled from the chip 544B so that the chip 544B could be reassembled with another package subassembly 536B. A curable liquid (not shown) may then be provided between the first and second microelectronic elements of the properly assembled packages (i.e., the packages including chips 544A and 544C) and the curable liquid cured so that the respective chips 544A, 544C and package subassemblies 536A, 536C are permanently assembled to one another.

These and other variations and combinations of the features discussed above can be utilized without departing from the present invention as defined by the claims. For example, in other preferred embodiments of the present invention, the microelectronic package may comprise a "fan-in/fan-out" chip package wherein the flexible leads are connected to respective chip contacts and the flexible leads extend both inwardly over the face of the chip to conductive terminals and outwardly beyond the periphery of the chip to conductive terminals located outside the periphery of the chip. In other embodiments, the releasable adhesive at one or more surface regions of the compliant element may include the compliant element material itself, i.e., an uncured or partially cured region of the compliant element. As such, the foregoing description of the preferred embodiments should be taken by way of illustration rather than by way of limitation of the claimed invention.

The invention claimed is:

1. A method of making a microelectronic package comprising the steps of:
   providing a first microelectronic element having electrically conductive parts and including first and second surfaces;
   providing a plurality of compliant elements over said first surface of the said first microelectronic element, each said compliant element including a releasable adhesive at a surface remote from said first microelectronic element;
   providing a second microelectronic element having a first surface, a second surface and electrically conductive parts exposed at said first surface of said second microelectronic element;
   abutting said second microelectronic element against said releasable adhesive so that said second microelectronic element and said first microelectronic element are releasably assembled such that they adhere to each other wherein said first surface of said second microelectronic element faces toward said first microelectronic element;
   connecting said electrically conductive parts of said first and second microelectronic elements; testing said releasably assembled package so as to identify whether the package is improperly assembled;
   if the package is improperly assembled, disassembling said first and second microelectronic elements from each other without the application of heat to said releasable adhesive;
   if the package is proper assembled, providing a curable liquid between said first and second microelectronic elements of said properly assembled package; and curing said curable liquid so that said first and second microelectronic elements are permanently assembled to one another.

2. A method as claimed in claim 1 wherein said testing step precedes the electrically connecting step.

3. A method as claimed in claim 1, wherein said testing step follows the electrically connecting step.

4. A method as claimed in claim 3, wherein the disassembling step includes the step of breaking the connection between said electrically conductive parts of said first and second microelectronic elements.

5. A method as claimed in claim 1, wherein said first microelectronic element of said package includes a dielectric film having conductive terminals accessible at an exterior surface of said package and flexible leads extending from said conductive terminals, said step of providing said curable liquid being performed so that said terminals are not covered by said curable liquid and remain accessible.

6. A method as claimed in claim 5, further comprising the step of providing a protective coverlay over said conductive terminals before the providing the curable liquid step so as to isolate said conductive terminals from said curable liquid.

7. A method of making a microelectronic package comprising the steps of:
   providing a first microelectronic element having electrically conductive parts and including first and second surfaces;
   providing a plurality of compliant elements over said first surface of the said first microelectronic element, each said compliant element including a releasable adhesive at a surface remote from said first microelectronic element;
   providing a second microelectronic element having electrically conductive parts;
   abutting said second microelectronic element against said releasable adhesive so that said second microelectronic element and said first microelectronic element are releasably assembled such that they adhere to each other but may be released from each other without heat, thereby forming a releasably assembled package;
   connecting said electrically conductive parts of said first and second microelectronic elements;
   testing said releasably assembled package so as to identify whether the package is improperly assembled;
   if the package is improperly assembled, disassembling said first and second microelectronic elements from each other without the application of heat to said releasable adhesive;
   if the package is proper assembled, providing a curable liquid between said first and second microelectronic elements of said properly assembled package; and curing said curable liquid so that said first and second microelectronic elements are permanently assembled to one another; wherein the disassembling step includes the step of breaking the connection between said electrically conductive parts of said first and second microelectronic elements;
   wherein said first microelectronic element of said package includes a dielectric film having conductive terminals accessible at an exterior surface of said package and flexible leads extending from said conductive terminals, said step of providing said curable liquid being performed so that said terminals are not covered by said curable liquid and remain accessible.

8. A method of making a microelectronic package comprising the steps of:
   providing a first microelectronic element having electrically conductive parts and including first and second surfaces;
   providing a plurality of compliant elements over said first surface of the said first microelectronic element, each said compliant element including a releasable adhesive at a surface remote from said first microelectronic element;
   providing a second microelectronic element having electrically conductive parts;
   abutting said second microelectronic element against said releasable adhesive so that said second microelectronic element and said first microelectronic element are releasably assembled such that they adhere to each other but may be released from each other without heat, thereby forming a releasably assembled package;
   connecting said electrically conductive parts of said first and second microelectronic elements;
   testing said releasably assembled package so as to identify whether the package is improperly assembled;
   if the package is improperly assembled, disassembling said first and second microelectronic elements from each other without the application of heat to said releasable adhesive;
   if the package is proper assembled, providing a curable liquid between said first and second microelectronic elements of said properly assembled package; and curing said curable liquid so that said first and second microelectronic elements are permanently assembled to one another;

wherein said first microelectronic element of said package includes a dielectric film having conductive terminals accessible at an exterior surface of said package and flexible leads extending from said conductive terminals, said step of providing said curable liquid being performed so that said terminals are not covered by said curable liquid and remain accessible.

9. A method according to claim 8, further comprising the step of providing a protective coverlay over said conductive terminals before the providing a curable liquid step so as to isolate said conductive terminals from said curable liquid.

* * * * *